United States Patent [19]

Diguet et al.

[11] 4,154,630

[45] May 15, 1979

[54] METHOD OF MANUFACTURING SEMICONDUCTOR DEVICES HAVING ISOELECTRONICALLY BUILT-IN NITROGEN AND HAVING THE P-N JUNCTION FORMED SUBSEQUENT TO THE DEPOSITION PROCESS

[75] Inventors: Daniel Diguet; Bernard Legros; Marc Mahieu, all of Caen, France

[73] Assignee: U.S. Philips Corporation, New York, N.Y.

[21] Appl. No.: 798,316

[22] Filed: May 19, 1977

Related U.S. Application Data

[63] Continuation of Ser. No. 644,066, Dec. 24, 1975, abandoned.

[30] Foreign Application Priority Data

Jan. 7, 1975 [FR] France ................... 75 00310

[51] Int. Cl.$^2$ ............... H01L 21/208; H01L 29/20
[52] U.S. Cl. ................... 148/171; 148/172; 148/175; 148/187; 357/16; 357/18; 357/63
[58] Field of Search ............. 148/171, 172, 175, 187; 156/621, 622, DIG. 70; 357/16, 17, 18, 63

[56] References Cited

U.S. PATENT DOCUMENTS

| | | | |
|---|---|---|---|
| 3,462,320 | 8/1969 | Lynch et al. ................ | 148/171 |
| 3,646,406 | 2/1972 | Logan et al. ................ | 357/17 |
| 3,725,749 | 4/1973 | Groves et al. ................ | 148/171 X |
| 3,893,875 | 7/1975 | Watanabe et al. ............ | 148/171 X |
| 3,931,631 | 1/1976 | Groves et al. ............... | 357/17 |
| 3,935,039 | 1/1976 | Beppu et al. ................ | 148/171 |
| 3,964,940 | 6/1976 | Hart et al. .................. | 148/175 |
| 3,984,263 | 10/1976 | Asao et al. ................. | 148/175 |

OTHER PUBLICATIONS

Logan et al., "Efficient Green Electroluminescent ----- GaP," Solid-State Electronics, vol. 14, No. 1, Jan. 1971, pp. 55-70.

Kasami et al., "High-Performance GaP Green LED Display," Toshiba Review, No. 102, Mar.-Apr. 1976, pp. 29-33.

Craford et al., "LED Technology," Solid State Technology, Jan. 1974, pp. 39-58.

*Primary Examiner*—L. Dewayne Rutledge
*Assistant Examiner*—W. G. Saba
*Attorney, Agent, or Firm*—Thomas A. Briody

[57] ABSTRACT

A method of manufacturing by liquid epitaxy III-V semiconductor crystals comprising a layer having isoelectronic nitrogen trapping centers.

The method is characterized in that the deposition of the nitrogen-doped layer is succeeded by the deposition of a deep layer containing less nitrogen doping after which a p-n junction is formed in the first layer.

16 Claims, 4 Drawing Figures

METHOD OF MANUFACTURING SEMICONDUCTOR DEVICES HAVING ISOELECTRONICALLY BUILT-IN NITROGEN AND HAVING THE P-N JUNCTION FORMED SUBSEQUENT TO THE DEPOSITION PROCESS

The present application is a continuation of U.S. application Ser. No. 644,066, filed Dec. 24, 1975, and now abandoned.

BACKGROUND OF THE INVENTION

The present invention relates to a method of manufacturing an electroluminescent diode in which a first layer containing at least one element of column III-B and at least one element of column V-B of the period table of elements and having a higher content of isoelectronically incorporated nitrogen than the substrate is deposited epitaxially on a substrate, a second layer having a lower content of isoelectronically incorporated nitrogen than the first layer is deposited on the first layer and a p-junction is formed in the first layer.

The present invention also relates to optoelectronic devices manufactured with the material obtained by said method.

It is known that the above-defined so-called III-V semiconductor materials having an indirect band structure can produce a luminescence on the condition that in given sites which are occupied by atoms of the constituent of column V, especially phosphorus and arsenic, the said constituent is replaced by a nitrogen atom. The nitrogen substitution atoms surrounded by normal sites form what is called isoelectronic trapping centers; these may pass to the excitation condition and form intermediate levels within the forbidden band. The luminescence, for example the green luminescence of GaP, is caused by the de-excitation of the electrons trapped at said levels.

It is also known that the same materials are used for the manufacture of photoreceivers.

The number of efficient radiation recombinations, which is estimated by measuring the level of the cathode luminescence, is proportional to the concentration of said trapping centers. It has been found, however, that when the nitrogen content is low, such proportionality is true and that when the nitrogen content increases, there occurs first, a saturation in which the luminous efficiency increases more slowly than the nitrogen concentration, after which, after a maximum, the direction of the curve is inverted.

It is known that the most efficient diode, especially the green luminescent diode of gallium phosphide, is obtained by liquid epitaxy of one or several layers, because the epitaxy from the gaseous phase involves a large number of crystal defects.

It has also been proposed in the U.S. Pat. No. 3,646,406, patented on Feb. 29, 1972, to perform the epitaxy in the presence of an atmosphere containing ammonia. The ammonia molecules which contact the gallium solution at high temperature, are broken down, the surface of the solution serving as a catalyst, and active nitrogen atoms dissolve in the gallium and deposit on the crystal lattice in the phosphor sites during the growth of the epitaxial layer.

The n and p dopings which are necessary to form the junction are manufactured during the epitaxy by means of lead sulphide and zinc vapours, the junction being epitaxial.

The drawback of the formation in this manner of a p-n junction during the epitaxial deposition of the layers is that the incorporation of nitrogen depends on the impurity, so that the partial nitrogen pressure has to be adapted to in accordance with the change of the impurity.

OBJECT OF THE INVENTION

It is an object of the method according to the invention to avoid this drawback. It is based on the recognition that the p-n junction can also be formed after the epitaxial layers have been obtained.

SUMMARY OF THE INVENTION

According to the present invention, the method of electroluminescent diode is produced which a first layer containing at least one element of column III-B and at least one element of column V-B of the periodic table of elements and having a higher content of isoelectronically incorporated nitrogen than the substrate, which first layer is deposited epitaxially on a substrate. A second layer having a lower content of isoelectronically incorporated nitrogen than the first layer is deposited on the first layer and a p-n junction is formed in the first layer. During the deposition of the first and the second layers a first doping impurity is incorporated therein so that both layers obtain a first conductivity type and the :-n junction is then formed in the first layer by the introduction therein of a second doping impurity which produces the opposite conductivity type in the layers.

The first epitaxial layer is deposited according to the invention, with the simple semiconductor material, for example GaP, which has no sites or only few sites that contain nitrogen substitution atoms. The critical phase for the nucleation involved in depositing the first layers occurs readily. The later introduction of nitrogen substitution atoms during and without interruption of, the deposition does not cause any disturbance of either the growth or the crystal lattice resulting therefrom, in which lattice the nitrogen atoms are very simply located at phosphor sites. On the contrary, with the heretofore used growth from a saturated solution of nitrogen atoms, at the beginning of the nucleation there result in the lattice defects that have a tendency of being permanent. This most serious source of defects is removed entirely by the method according to the invention.

Furthermore, due to the overall thickness of the epitaxial layers in the previously used methods, the nitrogen atoms originating from the dissociated first ammonia molecules remain in the gallium for a long period of time. This may result in detrimental clotting which will be referred to hereinafter and which is found in the solid phase. In the method according to the invention the beginning of the supply of ammonia can be delayed in such manner that the stay of the nitrogen atoms in the gallium solutions is as short as possible.

The substrate itself may be formed epitaxially and immediately preceding the deposition of the first layer.

The present method permits obtaining crystals whose resulting concentration level of active nitrogen is five times higher than the level obtained with the conventional method of equal metallurgical properties.

The fact that the substrate is not doped with nitrogen on the contrary has no drawback whatsoever, especially as regards the use in optoelectronics, since any nitrogen doping (the presence of which is essential in the radiation recombination zones) on the contrary involve beyond the said zones results in undesired absorption the received or emitted light. In contrast with what one might think, there is provided an extra advantage by preferably restricting the isoelectronic trapping centres to the radiation recombination zones which is realized by restricting the presence of ammonia to the phase of the deposition during the formation of the layer in which, or in the proximity of which the junction is formed.

It is not necessary for the second impurity to be introduced throughout the surface of the second layer. The second impurity is preferably introduced locally via the second epitaxial layer, the p-n junction in this case being present only partially in the first layer.

During the introduction of the second impurity a diffusion treatment is preferably used, which is preceded, for example, by an ion implantation of the second impurity.

Experience proves that from the instant at which ammonia is introduced, the degree of decomposition of the molecules at the surface of gallium, the diffusion of active nitrogen to the region of the deposit and the insertion thereof in the crystal lattice has to be carried out very rapidly and that the nitrogen concentration profile in the crystal shows an extremely steep slope, which is no drawback, while the nucleation is not affected.

Due to the absorption by nitrogen atoms in those zones at which there occurs no radiation recombination of the light generated in the radiation recombination zones, it may be favourable to omit the supply of ammonia without interrupting the epitaxy and to achieve same without nitrogen doping. Experience proves that the degree of nitrogen doping in the crystal then decreases regularly and rather rapidly.

The thickness of the nitrogen-doped layer is preferably larger than once the diffusion length of the minority carriers of the material in question and lower than four times said length.

The diffusion length of the minority carriers of the gallium phosphide is 10 $\mu$m with a doping content of $5 \times 10^{16}$ atoms per ccm and 1 $\mu$m with a doping of $5 \times 10^{17}$ atoms per ccm. The thickness of the non-doped surface layer is preferably lower than 10 $\mu$m.

It should be noted that the method according to the invention moreover permits obtaining nitrogen doping contents which are higher than those obtained so far. As mentioned above, the curve representing the intensity of the cathode luminescence generated as a function of the quantity of ammonia used, is, for the materials obtained by the known method, saturated any inverts from an ammonia content of 0.6 per 1000 in the carrier gas while for the materials obtained by the method according to the invention the curve remains linear to 3 per 1000 and inverts only with a content of 4 per 1000 without this causing a nucleation defect or a surface defect, in particular no single crater.

It should be mentioned that in contrast with other methods comprising the addition of nitrogen compounds in a condensed phase, for example GaN, the method according to the present invention has the benefit of the general advantages of the method of breaking down of which one of the most important is the purity.

The present invention can be realized by means of all known modes of application of the liquid epitaxy, whether it concerns methods which use the so-called vertical apparatus in which the saturated solution during epitaxy is placed above the seed in the boat, or methods which use so-called horizontal apparatus in which the saturated solution is placed beside the seed in the boat.

Advantageously, the crystal may be given a certain conductivity type by incorporating in the liquid phase of the epitaxial deposit at least one element which gives the desired conductivity type. However, it is more difficult, without interruption of the epitaxial deposition, to create a junction by giving two regions two opposite conductivity types; said interruption will cause the defects which it is desired to avoid.

As a first conductivity type is preferably chosen the n-type which is obtained by introducing hydrogen sulphide $H_2S$ above the liquid phase and performing this in known manner such that the concentration profile of the sulphur is flat. The region of the second conductivity type may preferably be formed after the end of the epitaxial deposition by diffusion, for example of zinc, or possibly by ion implantation, for example of zinc or beryllium.

It will be obvious that the diffusion depth has to be chosen in agreement with that of the nitrogen-doped zone. The present invention may be applied to binary or tertiary III–V semiconductor compounds in the range of compositions in which they have an indirect band structure, but especially to GaP and GaAsP.

BRIEF DESCRIPTION OF DRAWINGS

The invention will be described in greater detail with reference to the accompanying drawings.

For clarity, the proportions, especially as regards the thickness of the various layers, are not drawn to scale.

PREFERRED EMBODIMENT

Figure 1:
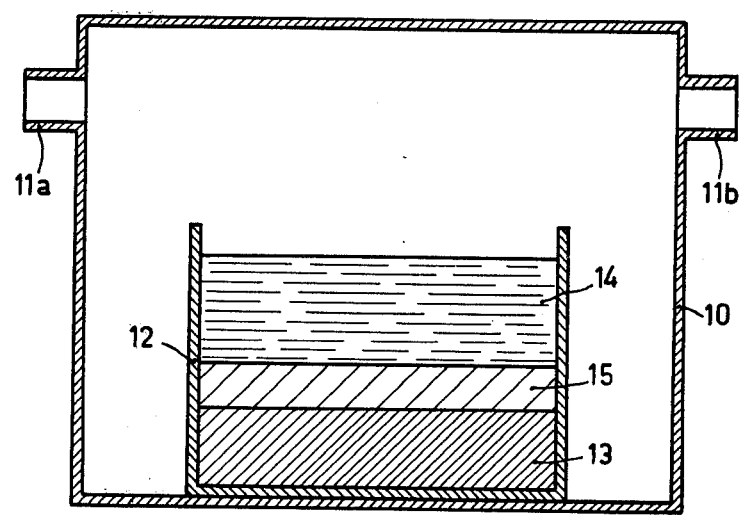
FIG. 1 shows diagrammatically a liquid epitaxy process which permits obtaining a crystal by means of the method according to the invention.

FIG. 1 shows a space 10 comprising gas inlets and outlets 11a and 11b, in which space there is located a crucible 12 which is preferably of graphite, and serves as a catalyst for the decomposition of ammonia.

A seed 13 of monocrystalline GaP of any type, for example the n-type is placed on the bottom of the crucible.

Between the tubes 11a and 11b a quantity of hydrogen sulphide diluted with hydrogen is provided. The quantity of hydrogen sulphide in the hydrogen is programmed in known manner so that the sulphur content in the deposited GaP, $N_D$, has a constant value between $5 \times 10^{16}$ and $10^{18}$ per ccm, for example, $2 \times 10^{17}$ atoms/ccm.

Advantageously, the overall pressure in the space is slightly higher than 1 atmosphere, so as to eliminate the influence of a possible leak.

The temperature of the system is raised to 950° C. by means of known methods which will not be described here, and a solution 14 saturated with GaP in gallium is poured on the seed.

Such a device in which the GaP solution in gallium is placed on the seed during epitaxy is termed vertical.

The temperature of the assembly is then slowly and regularly lowered at a rate of 0.5 to 3° C., for example 1° C., per 5 minutes.

In this manner the deep layer 15 of GaP which is not doped with nitrogen is deposited and is given a thickness of 30 μm, for example in 25 minutes. The crystal of FIG. 1 is shown in this stage.

Without interrupting the epitaxy, that is by causing the cooling curve to maintain its linear shape and without touching the crucible and its contents, the nitrogen bearing gas (e.g. ammonia) in the volume proportion between 0.05 per 1000 and 5 parts per 1000 (preferably between 0.1 and 3 parts per 1000) is introduced in the vector carrier gas and the deposition is continued for another 10 minutes during which time the layer 16 of nitrogen-doped gallium phosphide is formed in a thickness of 10 μm. The nitrogen doping is denoted in FIG. 2 by means of dots in the shading.

As soon as said deposition of the doped layer 16 has been performed without interrupting the epitaxy, the introduction of ammonia in the gas is discontinued and the surface layer 17 is deposited in a thickness of 5 μm in 5 minutes.

The deposition operation is then interrupted by eliminating the liquid phase. The resulting crystal has a flat surface of a very good quality, without craters.

From the surface 19 of the surface layer 17 a local zinc diffusion is carried out with known means to form the region 20.

Figure 2:
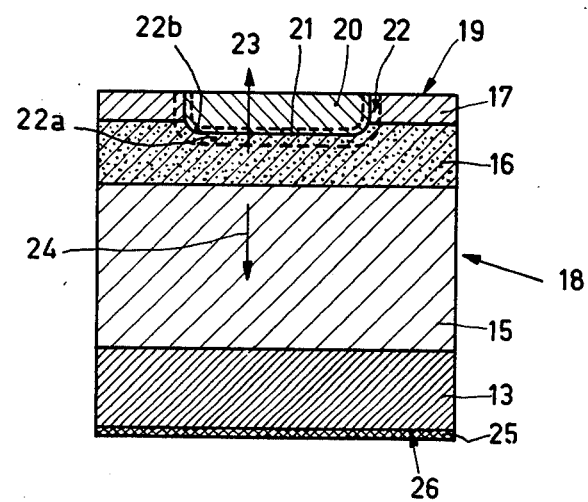
FIG. 2 shows a diode of GaP which has been obtained by one of the possible embodiments of the method according to the present invention.

The crystal is then given the desired thickness and a plate 18 is removed from the crystal as is shown in FIG. 2. The zinc diffusion is controlled in such manner that the junction 21 between the p and n-regions takes place within or at the boundary of the nitrogen-doped layer 16. The diffusion is carried out, for example, for 15 hours in a half open tube at 625° C.

In this manner the p doping impurity of the region 20 at the surface contains $5 \times 10^{18}$ zinc atoms and the junction 21 formed with the n type region has a depth of 7 μ, that is it reaches to within the nitrogen-doped layer 16.

The light originates from the radiation recombination region 22 whose boundaries on either side of the junction 21 are denoted by a broken line. Because the content of the conductivity type-producing doping impurities is higher in the p type region 20 than in n-type layer 16 of the radiation recombination zone 22 extends at 22a in the n-type region further than it does at 22b in the p-type region.

The light which can be generated in the radiation recombination region may leave the assembly in the direction of the arrow 23 without noteworthy absorption, the layer 17 showing no absorption sites.

The light which is emitted in the direction of the arrow 24, which is opposite to the arrow 23, can be reflected on a suitable layer 25 which is deposited on the face 26 of the plate 18 remote from the active surface 19. Only little light is absorbed due to the absence of nitrogen atoms in the layers 15 and 17 and a part of said light is hence useful.

Figure 3:
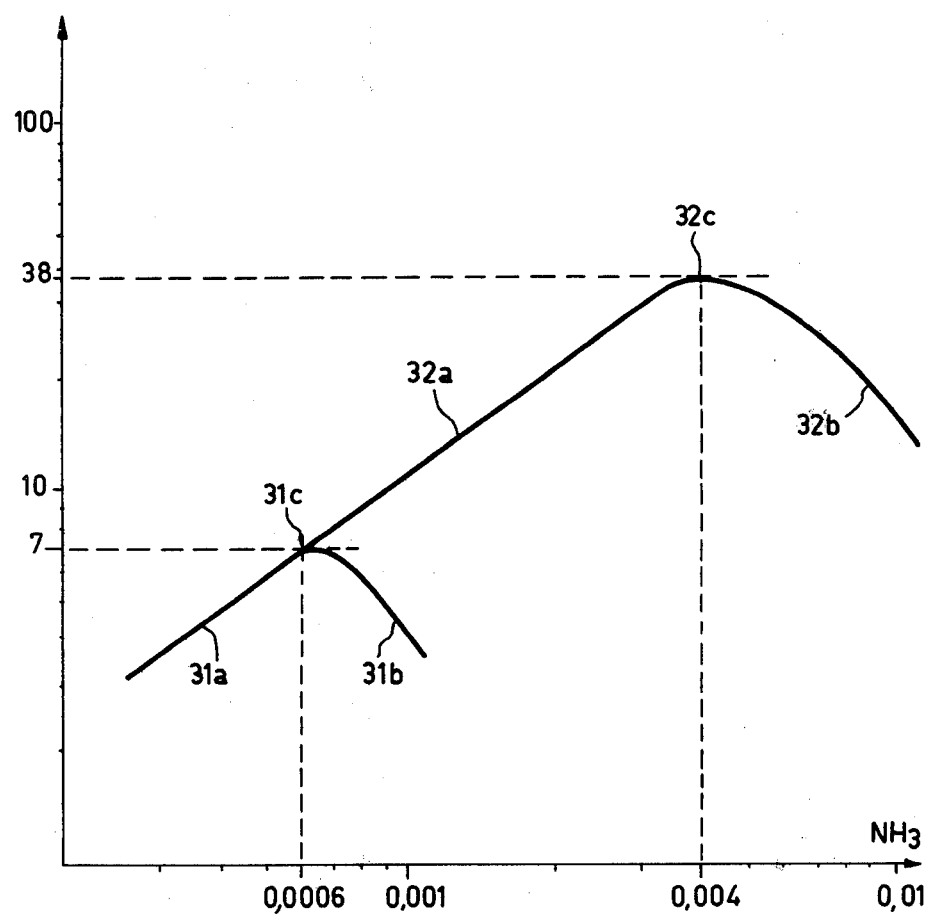
FIG. 3 shows the curve representing the luminous efficiency evaluated in cathode luminescence and expressed in arbitrary units as a function of the quantity of nitrogen introduced into the atmosphere for a GaP diode which is formed by means of the known method and for a GaP diode formed by means of the method according to the present invention.

FIG. 3 shows in logarithmic co-ordinates on the x-axis the ammonia part in the gas atmosphere for the liquid epitaxy process for producing the crystals used to make the diode. Plotted on the y-axis in arbitrary units is the luminous efficiency of said diode 1 as a cathode luminescence. This method is normally used in the optoelectronic industry.

The two branches 31a and 31b form the curve 31 which, at a concentration of NH$_3$ which lies near 0.6 parts per 1000, passes through a maximum 31c corresponding to a luminous efficiency of 7 units and which characterizes the diodes obtained by means of the prior art method.

The two branches 32a and 32b form the curve 32 which, at an NH$_3$ concentration of about 4 parts per 1000, passes through a maximum 32c corresponding to a luminous efficiency of 38 units and which characterizes the diodes obtained by the method according to the present invention. The luminous efficiency of the diodes obtained by means of the method according to the invention thus is five times higher than that of the diodes obtained by means of the known method. As shown in the Figure, a part of the branch 32a coincides with the branch 31a.

Figure 4:
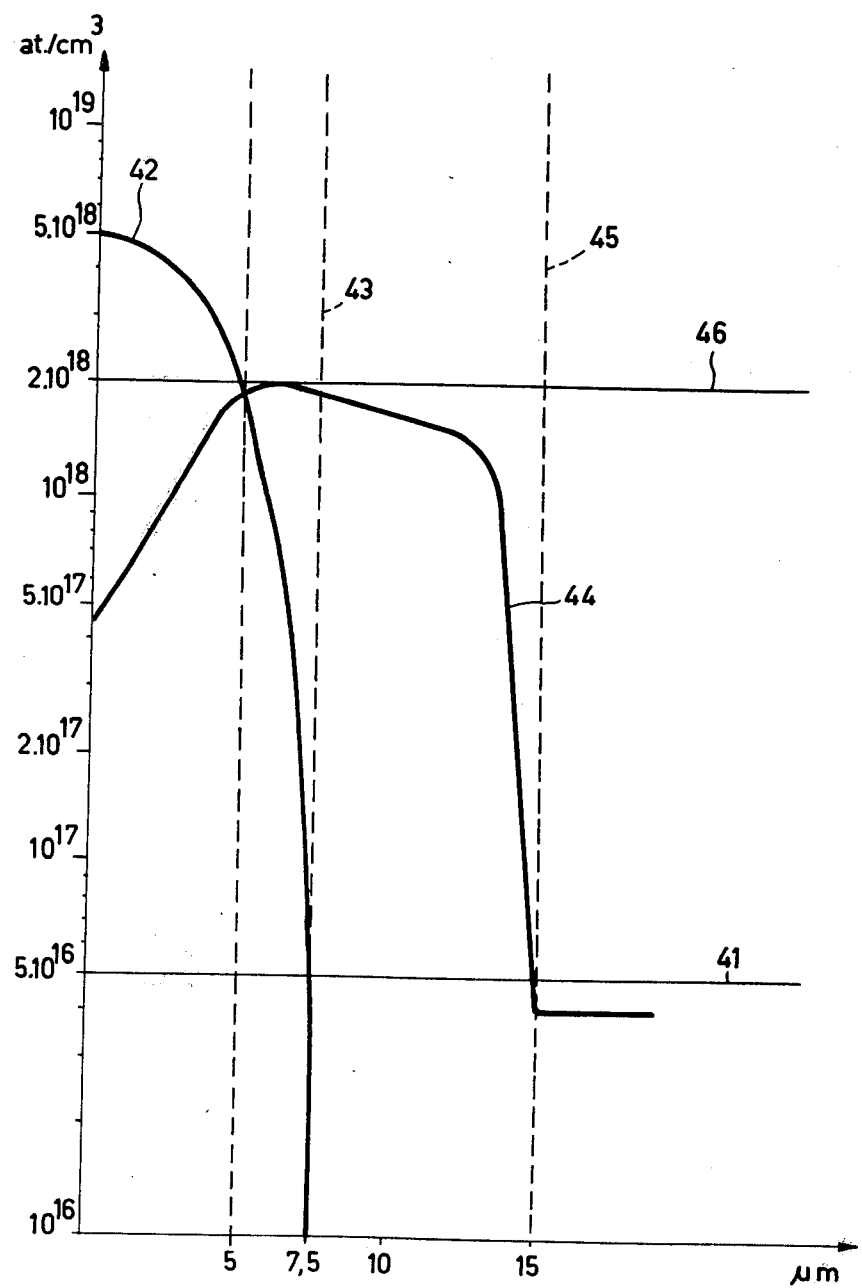
FIG. 4 shows the concentration profiles of the various dopings of the diode according to the invention of FIG. 2.

In FIG. 4, the depth in micrometers within the plate is plotted on the X-axis. The various faces are denoted by broken lines which are parallel to the Y-axis. For convenience the deep layer 15 is not shown in its entirety.

A number is plotted on the Y-axis which, according to the curve considered, represents the number of doping atoms $N_A$ or $N_D$ or the number of nitrogen atoms per ccm.

The number of doping atoms $N_D$ of sulphur is constant throughout the plate and is represented by the line 41 which is parallel to the X-axis.

The number of zinc doping atoms $N_A$ which is represented by the curve 42 decreases from a value of $4 \times 10^{18}$ at the surface of the plate.

Curves 42 and 41 intersect each other in the plane 43 where the junction is at a depth of 7.5 μm.

Curve 44 represents the content of active nitrogen, which content starts from a residual level which is lower than $2 \times 10^{17}$ atoms per ccm which is constant throughout the deep layer and which increases very rapidly from the surface 45 which forms the level of the atoms deposited at the beginning of the introduction into the space of the ammonia gas at the instant of deposition of the layer which is present at a depth of 15 μm, i.e., layer 16. It reaches the level of $10^{19}$ atoms per ccm which can not possibly be reached in the prior art method where from the beginning of the epitaxy (at the level of a plane in the Figure not shown) a nitrogen-saturated solution of GaP in gallium is used, while maintaining the crystal quality. It should be mentioned that said nitrogen doping content can be reached by vapour phase epitaxy but that in that case the resulting crystal quality is lower.

The nitrogen content in the surface layer then decreases.

The parallel line 46 on the X-axis denotes the nitrogen doping level obtained by means of the known method.

Experience provides that diodes of GaP which show a green luminescence and which are manufactured by means of the method according to the invention supply easily 2 to 3 times more light than the diodes manufactured by means of the known method.

What is claimed is:

1. A method of manufacturing an electroluminescent diode comprising the steps of:
   (a) providing a substrate;
   (b) epitaxially forming on said substrate a first layer containing at least one element of column III and at least one element of column V of the periodic table of elements and having a higher content of isoelectronically incorporated nitrogen than said substrate;
   (c) providing on said first layer a second layer containing said elements of said first layer and having a lower content of isoelectronically incorporated nitrogen than said first layer;
   (d) during the formation of said first and second layers, providing thereto a first doping impurity type material; and
   (e) forming a p.n junction in said layers by introducing into said layers a second doping impurity which causes a portion of said layers to have an opposite conductivity type.

2. A method as in claim 1, wherein said second impurity is introduced locally via said second epitaxial layer.

3. A method as in claim 1, wherein said second doping impurity is introduced by a diffusion treatment.

4. A method as in claim 3, wherein said second impurity is introduced by an ion implantation thereof prior to the diffusion treatment.

5. A method as in claim 1, wherein the thickness of said first layer is greater than once the diffusion length of the minority carriers of the material in question and smaller than four times said diffusion length.

6. A method as in claim 1, wherein the thickness of said second layer is smaller than 10 μ.

7. A method as in claim 1, wherein said first and second layers consist essentially of gallium phosphide.

8. A method as in claim 1, wherein the atmosphere during the epitaxial deposition permanently contains hydrogen.

9. A method as in claim 1, wherein, during the deposition of said layers, the atmosphere consists of hydrogen-diluted hydrogen sulphide, the hydrogen sulphide content of which is such that the sulphur content in the resulting gallium phosphide has a content value of about $2 \times 10^{17}$ atoms per ccm.

10. A method as in claim 1, wherein, during the deposition of said layers, the atmosphere consists of hydrogen-diluted hydrogen sulphide, the hydrogen sulphide content of which is such that the sulphur content in the resulting gallium phosphide has a constant value of about $5 \times 10^{16}$ to $10^{18}$ atoms per ccm.

11. A method as in claim 1, wherein, during the deposition of said nitrogen-doped layer, ammonia gas is added to the atmosphere which permanently contains hydrogen.

12. A method as in claim 11, wherein the ammonia partial pressure is about between 0.05 and 5 parts per 1000.

13. A method as in claim 12, wherein the ammonia partial pressure is about between 0.1 and 3 parts per 1000.

14. A method as in claim 11, wherein the overall pressure of the atmosphere containing ammonia is between 1 and 1.3 atmosphere.

15. A method as in claim 1, wherein said epitaxy is carried out in a vertical device starting from a given quantity of gallium phosphide dissolved in a given volume of gallium and, after adjusting the contact between said solution and the seed, the epitaxial deposition of the various layers is carried out by continuously cooling said volume.

16. A method as in claim 1, comprising the steps of forming a junction by zinc diffusion after the epitaxial method.

* * * * *

UNITED STATES PATENT AND TRADEMARK OFFICE
CERTIFICATE OF CORRECTION

PATENT NO. : 4,154,630
DATED : May 15, 1979
INVENTOR(S) : DANIEL DIGUET ET AL

It is certified that error appears in the above-identified patent and that said Letters Patent are hereby corrected as shown below:

Claim 1, line 7, "isolec-" should be -- isoelec- --

Signed and Sealed this

Second Day of October 1979

[SEAL]

Attest:

RUTH C. MASON
Attesting Officer

LUTRELLE F. PARKER
Acting Commissioner of Patents and Trademarks